United States Patent
Wu et al.

(10) Patent No.: US 9,021,331 B2
(45) Date of Patent: Apr. 28, 2015

(54) METHOD AND APPARATUS FOR GENERATION OF SOFT DECISION ERROR CORRECTION CODE INFORMATION

(71) Applicant: LSI Corporation, San Jose, CA (US)

(72) Inventors: Yunxiang Wu, Cupertino, CA (US); Zhengang Chen, San Jose, CA (US); Erich F. Haratsch, Bethlehem, PA (US)

(73) Assignee: Seagate Technology LLC, Cupertino, CA (US)

( * ) Notice: Subject to any disclaimer, the term of this patent is extended or adjusted under 35 U.S.C. 154(b) by 88 days.

(21) Appl. No.: 13/893,832

(22) Filed: May 14, 2013

(65) Prior Publication Data

US 2014/0281822 A1 Sep. 18, 2014

Related U.S. Application Data

(60) Provisional application No. 61/782,837, filed on Mar. 14, 2013.

(51) Int. Cl.
| | |
|---|---|
| *G06F 11/10* | (2006.01) |
| *H03M 13/11* | (2006.01) |
| *H03M 7/42* | (2006.01) |
| *H03M 13/29* | (2006.01) |
| *H03M 13/45* | (2006.01) |
| *H03M 13/00* | (2006.01) |

(52) U.S. Cl.
CPC ....... *G06F 11/1068* (2013.01); *H03M 13/1125* (2013.01); *H03M 7/42* (2013.01); *H03M 13/45* (2013.01); *H03M 13/1111* (2013.01); *H03M 13/2927* (2013.01); *H03M 13/00* (2013.01)

(58) Field of Classification Search
CPC ....... H03M 7/42; H03M 13/45; H03M 13/00; H03M 13/1125; H03M 13/1111; H03M 13/2927; G06F 11/1068
USPC .......................................... 714/773, 759, 794
See application file for complete search history.

(56) References Cited

U.S. PATENT DOCUMENTS

| | | | |
|---|---|---|---|
| 7,656,707 B2 | 2/2010 | Kozlov | |
| 8,848,438 B2 * | 9/2014 | Hu | 365/185.03 |
| 2009/0154236 A1 * | 6/2009 | Kozlov | 365/185.03 |
| 2011/0167305 A1 | 7/2011 | Haratsch et al. | |
| 2011/0225350 A1 * | 9/2011 | Burger et al. | 711/103 |
| 2011/0246859 A1 * | 10/2011 | Haratsch et al. | 714/773 |
| 2012/0033767 A1 * | 2/2012 | Wilborn et al. | 375/341 |
| 2012/0072805 A1 * | 3/2012 | Tseng et al. | 714/773 |
| 2012/0079355 A1 * | 3/2012 | Patapoutian et al. | 714/780 |
| 2012/0236641 A1 | 9/2012 | Hu | |
| 2012/0297273 A1 * | 11/2012 | Sakaue et al. | 714/773 |
| 2013/0117640 A1 * | 5/2013 | Tai et al. | 714/780 |
| 2013/0163328 A1 * | 6/2013 | Karakulak et al. | 365/185.2 |

* cited by examiner

*Primary Examiner* — John P Trimmings
(74) *Attorney, Agent, or Firm* — Daniel J. Santos; Smith Risley Tempel Santos LLC

(57) ABSTRACT

A method and apparatus for generating soft decision error correction code information. The method includes generating or creating a lookup table (LUT), such as a log likelihood ratio (LLR) lookup table, characterizing a flash memory device. The method also includes loading the lookup table into the SSD controller. The method also includes accessing the lookup table to assign LLR or other characteristic values to the cells of a flash memory device. The method also includes decoding the data in a flash memory device using the soft decision information provided by the lookup table and assigned to the appropriate cells of the flash memory device.

15 Claims, 5 Drawing Sheets

| Decision Region | A0 | | | | A1 | | | | A2 | | | | A3 | | | |
|---|---|---|---|---|---|---|---|---|---|---|---|---|---|---|---|---|
| Retention\PEC | 1K | 3K | | 7K | 1K | 3K | | 7K | 1K | 3K | | 7K | 1K | 3K | | 7K |
| 1 month | LLR_1M_1K | LLR_1M_1K | LLR_1M_3K | LLR_1M_7K | LLR_1M_1K | LLR_1M_3K | LLR_1M_7K | LLR_1M_1K | LLR_M_3K | LLR_M_3K | LLR_1M_7K | LLR_1M_1K | LLR_1M_3K | LLR_1M_7K |
| 3 months | LLR_3M_1K | LLR_3M_3K | LLR_3M_7K | LLR_3M_1K | LLR_3M_3K | LLR_3M_7K | LLR_3M_1K | LLR_3M_3K | LLR_3M_7K | LLR_3M_1K | LLR_3M_3K | LLR_3M_7K |
| 6 months | LLR_6M_1K | LLR_6M_3K | LLR_6M_7K | LLR_6M_1K | LLR_6M_3K | LLR_6M_7K | LLR_6M_1K | LLR_6M_3K | LLR_6M_7K | LLR_6M_1K | LLR_6M_3K | LLR_6M_7K |

*FIG. 6*

METHOD AND APPARATUS FOR GENERATION OF SOFT DECISION ERROR CORRECTION CODE INFORMATION

STATEMENT REGARDING RELATED APPLICATIONS

This patent application claims priority under 35 U.S.C. §119(e) to U.S. Provisional Patent Application Ser. No. 61/782,837, filed on Mar. 14, 2013, entitled, "Method and Apparatus For Generation of Soft Decision Error Correction Code Information," the entire contents which are hereby incorporated by reference.

BACKGROUND OF THE INVENTION

1. Field of the Invention

The invention relates to the use of error correction codes for flash memory devices. More particularly, the invention relates to the generation of soft decision information for error correction codes for flash memory devices.

2. Description of the Related Art

With aggressive process scaling, raw bit error rate (BER) of NAND flash memory device is becoming relatively poorer and poorer. To maintain the same level of reliability, solid state device (SSD) controllers are adopting soft decision information, e.g., soft decoded error correction codes (ECC), such as low density parity check (LDPC) codes, for purposes of error correction. These soft decoded error correction codes are more powerful in correcting errors, however, soft decoded error correction codes typically require that the input to the error correction decoder be soft decision information of flash channels. Such soft decision information typically is in the form of a log likelihood ratio (LLR).

Because conventional flash memory devices do not provide soft decision information, SSD controllers have to generate soft decision information using either hardware or software. Some recent flash memory devices have started to provide some sort of soft decision information, but the typical soft decision information being provided often does not meet the acceptable quality standards. Also, conventionally, producing relatively high quality soft decision information from NAND flash memory devices typically is not a cost effective option. Therefore, it remains the task of SSD controllers to produce soft decision information for error correction codes.

SUMMARY OF THE INVENTION

The invention is embodied in a method and apparatus for generating soft decision information for error correction codes. The method includes generating or creating a lookup table (LUT), such as a log likelihood ratio (LLR) lookup table, characterizing a flash memory device. The method also includes loading the lookup table into the SSD controller. The method also includes accessing the lookup table to assign LLR or other characteristic values to the cells of a flash memory device. The method also includes decoding the data in a flash memory device using the soft decision information provided by the lookup table and assigned to the appropriate cells of the flash memory device.

BRIEF DESCRIPTION OF THE DRAWINGS

FIG. 6 is a schematic view of a log likelihood ratio (LLR) lookup table (LUT), according to embodiments of the invention.

DETAILED DESCRIPTION OF EXEMPLARY EMBODIMENTS

Figure 1:
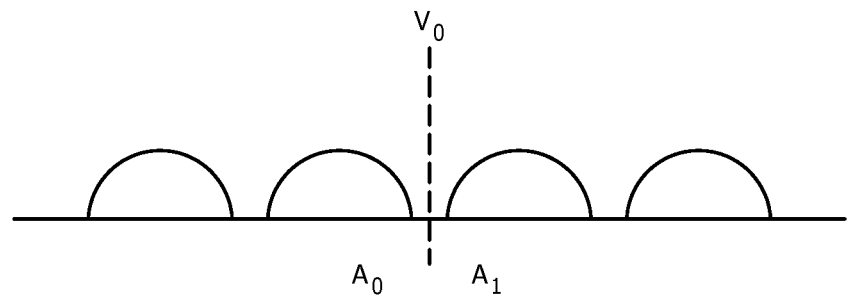
FIG. 1 is a graphical view of a normal read of a least significant bit (LSB) page for a multi level cell (MLC) flash memory device.

In the following description, like reference numerals indicate like components to enhance the understanding of the invention through the description of the drawings. Also, although specific features, configurations and arrangements are discussed hereinbelow, it should be understood that such is done for illustrative purposes only. A person skilled in the relevant art will recognize that other steps, configurations and arrangements are useful without departing from the spirit and scope of the invention.

As used in this description, the terms "component," "module," and "system," are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more. In addition, these components may execute from various computer readable media having various data structures stored thereon. The components may communicate by way of local and/or remote processes, such as in accordance with a signal having one or more data packets, e.g., data from one component interacting with another component in a local system, distributed system, and/or across a network, such as the Internet, with other systems by way of the signal.

Figure 2:
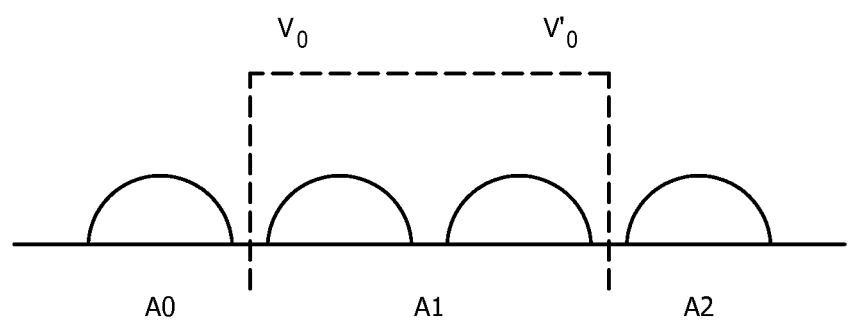
FIG. 2 is a graphical view of a normal read of a most significant bit (LSB) page for an MLC flash memory device.
Figure 3:
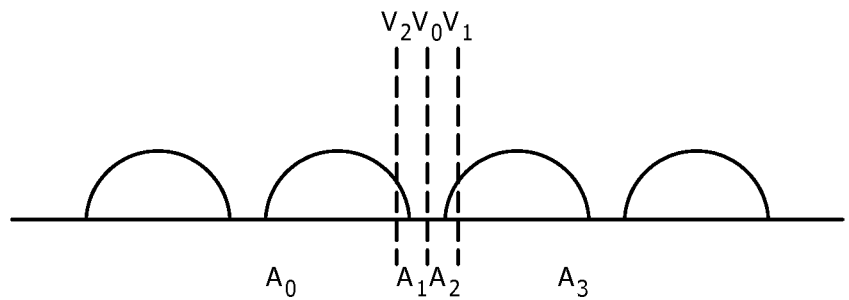
FIG. 3 is a graphical view of retry reads for three varying reference voltages ($V_{REF}$) for an LSB page for an MLC flash memory device.
Figure 4:
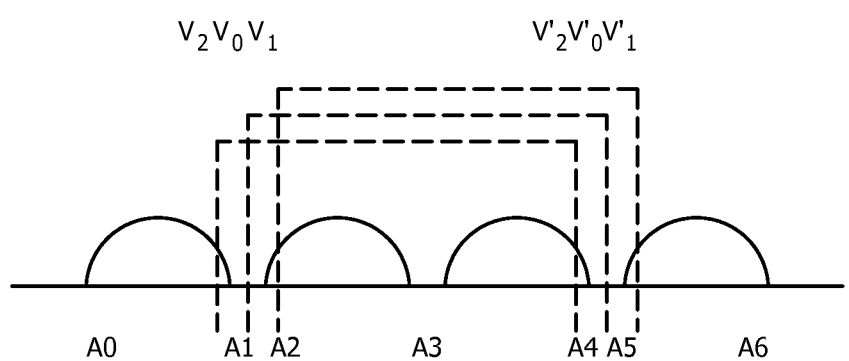
FIG. 4 is a graphical view of retry reads for three varying reference voltages ($V_{REF}$) for an MSB page for an MLC flash memory device.

Normal reads of LSB and MSB pages of MLC are shown in FIG. 1 and FIG. 2. One Vref value ($V_0$) is required for reading LSB pages, and a pair of Vrefs ($V_0$ and $V'_0$) are required for reading MSB pages. When a normal read fails, SSD controllers enter retry mode and a number of retry reads are performed with varying Vrefs. FIG. 3 and FIG. 4 show retry reads of three varying Vrefs for LSB and MSB, respectively. As we know, all the NAND flash devices on the market have built-in retry functions.

In multi level cell (MLC) flash memory devices, two bits (or more than two) are programmed in one cell. Among the bits, a lower bit is denoted as the Least Significant Bit (LSB) and an upper bit is denoted as the Most Significant Bit (MSB). Both the LSB and the MSB are in the same cells included in a same wordline on a cell array. However, since the LSB and the MSB form two different pages, the LSB and the MSB are respectively programmed by their respective page addresses.

FIG. 1 is a graphical view of a normal read of a least significant bit (LSB) page for a multi level cell (MLC) flash memory device. FIG. 2 is a graphical view of a read of a most significant bit (LSB) page for an MLC flash memory device.

One $V_{REF}$ value ($V_0$) is required for reading LSB pages, and a pair of $V_{REFS}$ ($V_0$ and $V'_0$) are required for reading MSB pages. When a normal read fails, the solid state device (SSD) controllers that is reading the MLC flash memory device enters a retry mode and performs a number of retry reads using varying $V_{REFS}$.

FIG. 3 is a graphical view of retry reads for three varying reference voltages ($V_{REF}$) for an LSB page for a MLC flash memory device. FIG. 4 is a graphical view of retry reads for three varying reference voltages ($V_{REF}$) for an MSB page for a MLC flash memory device. Conventional NAND flash memory devices have built-in retry functions.

When $V_{REFS}$ are applied, the cell voltage ($V_T$) axes (i.e., the horizontal axes in FIGS. 1 to 4) are divided into different number of regions (for, example, regions $A_0$ and $A_1$ in FIG. 1, regions $A_0$ to $A_2$ in FIG. 2, regions $A_0$ to $A_3$ in FIG. 3, and regions $A_0$ to $A_6$ in FIG. 4). These regions can be referred to as decision regions.

The goal of log likelihood ratio (LLR) generation is to assign a value to each region. All bits that reside in the same decision region have the same LLR. Therefore, the outcome of LLR generation is an LLR lookup table (LUT), with each LLR entry corresponding to one decision region. For purposes of discussion, it should be understood that LLR LUT and LLR can be used interchangeably.

For each individual read, the flash memory device outputs a hard decision bit sequence. This sequence conventionally is used as a hard-decision input to the error correction code (ECC) decoders in the SSD controller. The purpose of hard-decision read retries is to try to get the best sequence (i.e., with the lowest raw bit error rate) by varying read reference voltages. The hard-decision read retries output either a logical 0 or a logical 1 for each bit read. The main difference between hard-decision read retries and soft decision read retries is that soft decision read retries combine the bit sequences of the current read with previous reads together and use the combination for generating reliability information (e.g., a LLR) of each bit.

Obtaining bit sequences, e.g., via a hard-decision read retry, is insufficient to calculate an LLR. In addition, an SSD controller needs to estimate parameters of the four $V_T$ distributions shown on FIGS. 1-4. There are many ways to estimate the distributions. Generally, one has to have control of setting reference voltages ($V_{REFS}$) to different values to gather statistics of the distributions. However, many low-end flash memory devices do not allow for control of setting $V_{REFS}$ as needed, and many flash memory device vendors do not provide this kind of command. Therefore, the needed kind of control for setting $V_{REF}$ typically is not available.

Many flash memory devices usually only have a pre-defined hard-decision retry read sequence that cannot be changed or customized. This creates difficulty not only in optimizing the retry read $V_{REFS}$, but also in estimating the distribution parameters in the SSD controller. Because of these difficulties, the ability to generate an optimal LLR LUT is relatively.

To allow for soft decision decoding, such as soft LDPC (low density parity check) decoding, embodiments of the invention provide a method and apparatus for generating LLR LUTs without the ability to control the setting of $V_{REFS}$. Embodiments of the invention generate or obtain LLRs via offline flash memory device characterization for a different number of program-erase cycles (PEC) and retention times. The generated LLR LUTs then are made available to the SSD controller and used for performing soft LDPC decoding.

Figure 5:
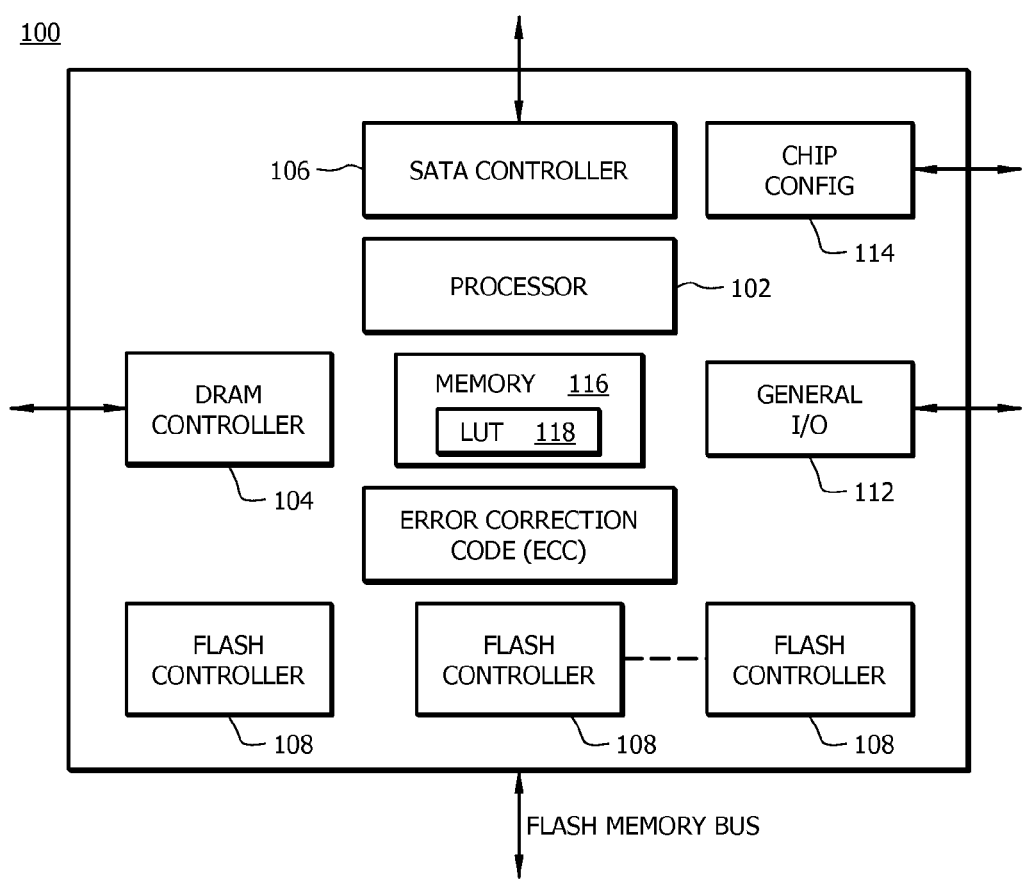
FIG. 5 is a schematic view of a solid state device (SSD) controller apparatus, according to embodiments of the invention.

FIG. 5 is a schematic view of a solid state device (SSD) controller apparatus 100, according to embodiments of the invention. The SSD controller 100 includes a general processor 102, which manages the operation of the SSD controller, including reading data from and writing data to the SSD controller. The SSD controller 100 also can include one or more controllers, such as a dynamic random access memory (DRAM) controller 104, a serial ATA (SATA) controller 106, and one or more flash memory device controllers 108, which couple the SSD controller 100 to a flash memory bus or other suitable flash memory device.

The SSD controller 100 also can include a general input/output component 112, as well as a chip configuration component 114. The SSD controller 100 includes one or more processor memory devices 116. According to embodiments of the invention, one or more lookup tables (LUTs) 118 can be loaded into the processor memory device 116, as will be discussed in greater detail hereinbelow. The LUT 118 can be loaded into the processor memory device 116 during or as part of manufacture of the SSD controller 100. Alternatively, the LUT 118 can be loaded into the processor memory device 116 after the SSD controller 100 has been manufactured.

The processor 102 can include any suitable elements, such as microprocessors, memory and hard-wired logic, that in accordance with suitable programming or configuration logic allow the processor 102 to effect the functions or methods described herein, as well as any other suitable functions that persons skilled in the art understand are characteristic of conventional SSD controllers 100. Such programming logic can be stored in the form of software or firmware that has been loaded into memory for execution by one or more processors, either on an as-needed or random-access basis or as firmware stored in non-volatile memory (e.g., programmable read-only memory).

One or more of the components within the SSD controller 100, including the processor 102, the DRAM controller 104, the SATA controller 106, the flash memory controllers 108, the I/O element 112, the chip configuration element 114 and the processor memory device 116, can be comprised partially or completely of any suitable structure or arrangement, e.g., one or more integrated circuits. Also, it should be understood that the SSD controller 100 includes other components, hardware and software (not shown) that are used for the operation of other features and functions of the SSD controller 100 not specifically described herein.

The SSD controller 100 can be partially or completely configured in the form of hardware circuitry and/or other hardware components within a larger device or group of components. Alternatively, the SSD controller 100 can be partially or completely configured in the form of software, e.g., as processing instructions and/or one or more sets of logic or computer code. In such configuration, the logic or processing instructions typically are stored in a data storage device (not shown). The data storage device typically is coupled to a processor, such as the processor 102. The processor accesses the necessary instructions from the data storage device and executes the instructions or transfers the instructions to an appropriate location within the SSD controller 100.

Embodiments of the invention are discussed using an MLC flash memory device (i.e., two-bit per cell). However, embodiments of the invention also can be applied to other NAND flash memory devices, such as single-level cell (SLC) flash memory devices and triple-level cell (TLC) flash memory devices.

As discussed hereinabove, without the control of setting $V_{REF}$, it is relatively difficult to gather statistics of cell voltage distributions. This poses a problem in calculating LLRs. However, according to embodiments of the invention, through the use of offline flash memory device characterization where genie data (i.e., data written to the flash memory device) is available, the LLRs can be characterized for each hard-decision region. With help of genie data, the use of offline flash memory device characterization can determine the relative positions of the $V_{REFS}$ used in the fixed sequence of hard-decision retry, which helps in mapping multi-read hard-decision patterns to decision regions. The use of offline flash memory device characterization also can help find the relative width of each decision region, which helps to characterize the $V_T$ distribution at different use conditions, e.g., for different program-erase cycles (PEC) and different retention times.

According to embodiments of the invention, the use of offline flash memory device characterization enables soft LDPC decoding to improve the endurance of the SSD controller. Also, the use of offline flash memory device characterization enables soft LDPC decoding to the lower error floor of hard LDPC decoding.

The main characteristic of NAND flash memory device channels is time-variant, e.g. the distributions change with the number of program-erase cycles (PEC) and the retention time. When LLR characterization is performed, LLRs are characterized as functions of PECs and retention times. Depending on the granularity of the PECs and the retention times that are to be used, the size of the generated LLR LUT will be different.

As an example, a three-read retry of LSB pages (shown in FIG. 3) is used to describe the structure of the LLR LUT that is generated. For example, suppose there is a classification of flash memory device channel variation to PEC numbers of 1000, 3000, and 7000, and a retention time of 1 month, 3 months, and 6 months. The generated LLR LUT is shown in FIG. 6, which is a log likelihood ratio (LLR) lookup table (LUT), according to embodiments of the invention. It should be understood that similar LUTs for other numbers of retries can and should be characterized.

Once the appropriate LUTs have been generated using this offline flash memory device characterization, the LLR LUTs can be used by the SSD controller. As discussed hereinabove, the LLR LUTs can be loaded into a processor memory device 116 of the SSD controller 100, either during the manufacture of the SSD controller 100 or after the SSD controller 100 has been manufactured.

After a number of retry reads have been performed, the voltage of each NAND flash memory device cell can be associated to one of the decision regions. Based on the PEC count and the estimated retention time, an LLR value is selected and assigned to the appropriate cell. For example, as shown in FIG. 6, if the voltage of a cell is in decision region $A_0$, and the flash memory device has endured 3000 PECs, and the estimated retention time is 3 months, the LLR_3M_3K value is selected and assigned to this cell.

Figure 7:
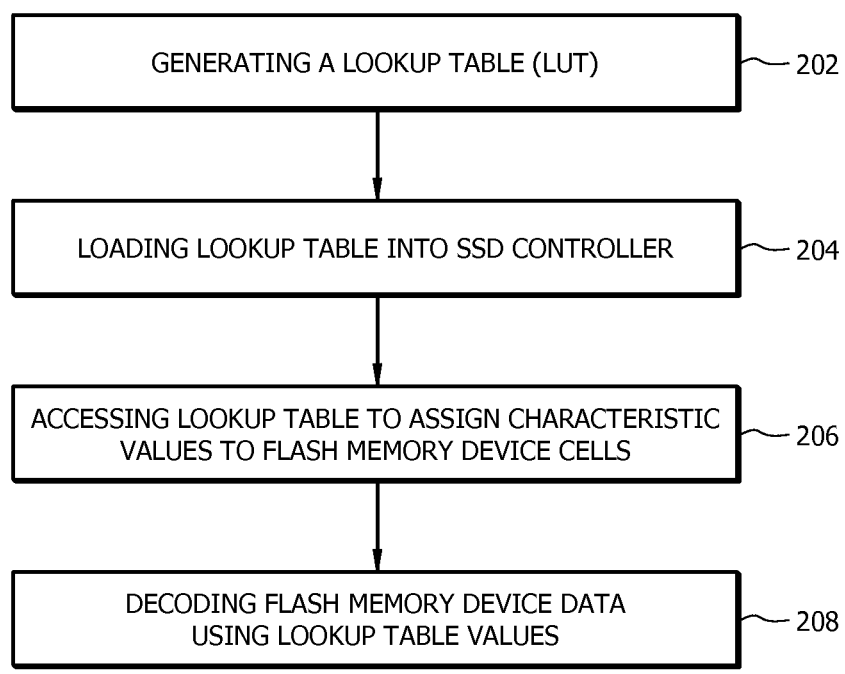
FIG. 7 is a block diagram of a method for generation of soft decision information for error correction codes (ECCs), according to embodiments of the invention.

FIG. 7 is a block diagram of a method 200 for generation of soft decision error correction code (ECC) information, according to embodiments of the invention. The method 200 includes generating or creating 202 a lookup table (LUT) characterizing a flash memory device. As discussed hereinabove, the lookup table can be an LLR lookup table. Also, as discussed hereinabove, the lookup table can be generated or created offline.

The method 200 also includes loading 204 the lookup table into the SSD controller. As discussed hereinabove, the lookup table can be loaded into a memory device or other portion of the SSD controller during or as part of manufacture of the SSD controller. Alternatively, the lookup table can be loaded into the SSD controller once the SSD controller has been manufactured.

The method 200 also includes accessing 206 the lookup table to assign LLR or other characteristic values to the cells of a flash memory device. For example, after a number of retry reads have been performed for a particular flash memory device, the voltage of each cell of the flash memory device can be associated to one of the decision regions. Based on the PEC count and the estimated retention time, an LLR value is selected and assigned to the appropriate cell.

The method 200 also includes decoding 208 the data in a flash memory device using the soft decision information provided by the lookup table and assigned to the appropriate cells of the flash memory device.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter," "then," "next," and other similar words are not intended to limit the order of the steps. These words simply are used to guide the reader through the description of the exemplary method. Also, one of ordinary skill in programming will be able to write computer code or identify appropriate hardware and/or circuits to implement the disclosed invention without difficulty, based on the flow charts and associated description in this specification. Therefore, disclosure of a particular set of program code instructions or detailed hardware devices is not considered necessary for an adequate understanding of how to make and use the invention.

In one or more aspects, the functions described herein may be implemented in hardware, software, firmware, or any combination thereof. If implemented in software, the functions may be stored on or transmitted as one or more instructions or code on a non-transitory computer-readable medium. Non-transitory computer-readable media includes both computer storage media and communication media including any tangible medium that facilitates transfer of a computer program from one place to another. A storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other tangible medium that may be used to carry or store desired program code in the form of instructions or data structures and that may be accessed by a computer.

It will be apparent to those skilled in the art that many changes and substitutions can be made to the embodiments of the invention herein described without departing from the spirit and scope of the invention as defined by the appended claims and their full scope of equivalents.

The invention claimed is:
1. A method for providing soft decision information for error correction codes for a flash memory device, comprising:
   generating an offline lookup table of characteristic values of the flash memory device;

loading the lookup table into a solid state device (SSD) controller to which the flash memory device is coupled;

accessing the lookup table to assign characteristic values to one or more cells of the flash memory device; and decoding data in the flash memory device using the characteristic values provided by the lookup table and assigned to the one or more cells of the flash memory device to provide soft decision information for error correction codes.

2. The method as recited in claim 1, wherein the lookup table is a log likelihood ratio (LLR) lookup table.

3. The method as recited in claim 1, wherein the lookup table is a log likelihood ratio (LLR) lookup table based on a plurality of program-erase cycles (PEC) and retention times for the flash memory device.

4. The method as recited in claim 1, wherein the lookup table is loaded into the solid state device controller during the manufacture of the solid state device controller.

5. The method as recited in claim 1, wherein the lookup table is loaded into the solid state device controller after the solid state device controller has been manufactured.

6. A solid state device (SSD) controller, comprising:
 a processor;
 a processor memory device coupled to the processor;
 a lookup table loaded into the memory device of characteristic values of a flash memory device coupled to the solid state device controller,
 wherein the processor is configured to access the lookup table to assign characteristic values to one or more cells of the flash memory device, and
 wherein the processor is configured to decode data in the flash memory device using the characteristic values provided by the lookup table and assigned to the one or more cells of the flash memory device to provide soft decision information for error correction codes.

7. The solid state device controller as recited in claim 6, wherein the lookup table is a log likelihood ratio (LLR) lookup table.

8. The solid state device controller as recited in claim 6, wherein the lookup table is a log likelihood ratio (LLR) lookup table based on a plurality of program-erase cycles (PEC) and retention times for the flash memory device.

9. The solid state device controller as recited in claim 6, wherein the lookup table is loaded into the solid state device controller during the manufacture of the solid state device controller.

10. The solid state device controller as recited in claim 6, wherein the lookup table is loaded into the solid state device controller after the solid state device controller has been manufactured.

11. A non-transitory computer readable medium storing instructions that carry out a method for providing soft decision information for error correction codes for a flash memory device, the method comprising:
 instructions for generating an offline lookup table of characteristic values of the flash memory device;
 instructions for loading the lookup table into a solid state device (SSD) controller to which the flash memory device is coupled;
 instructions for accessing the lookup table to assign characteristic values to one or more cells of the flash memory device; and
 instructions for decoding data in the flash memory device using the characteristic values provided by the lookup table and assigned to the one or more cells of the flash memory device to provide soft decision information for error correction codes.

12. The non-transitory computer readable medium as recited in claim 11, wherein the lookup table is a log likelihood ratio (LLR) lookup table.

13. The non-transitory computer readable medium as recited in claim 11, wherein the lookup table is a log likelihood ratio (LLR) lookup table based on a plurality of program-erase cycles (PEC) and retention times for the flash memory device.

14. The non-transitory computer readable medium as recited in claim 11, wherein the lookup table is loaded into the solid state device controller during the manufacture of the solid state device controller.

15. The non-transitory computer readable medium as recited in claim 11, wherein the lookup table is loaded into the solid state device controller after the solid state device controller has been manufactured.

* * * * *